United States Patent
Shin et al.

(10) Patent No.: US 9,155,199 B2
(45) Date of Patent: Oct. 6, 2015

(54) PASSIVE DEVICE EMBEDDED IN SUBSTRATE AND SUBSTRATE WITH PASSIVE DEVICE EMBEDDED THEREIN

(71) Applicant: Samsung Electro-Mechanics Co., Ltd., Suwon (KR)

(72) Inventors: Yee Na Shin, Suwon (KR); Yul Kyo Chung, Yongin (KR); Seung Eun Lee, Sungnam (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 75 days.

(21) Appl. No.: 14/041,235

(22) Filed: Sep. 30, 2013

(65) Prior Publication Data
US 2014/0090881 A1    Apr. 3, 2014

(30) Foreign Application Priority Data
Sep. 28, 2012   (KR) .................. 10-2012-0108952

(51) Int. Cl.
*H05K 1/18* (2006.01)
*H01G 4/228* (2006.01)
*H05K 3/46* (2006.01)

(52) U.S. Cl.
CPC .............. *H05K 1/185* (2013.01); *H05K 3/4682* (2013.01); *H05K 2203/308* (2013.01)

(58) Field of Classification Search
CPC  H05K 1/185; H05K 3/4682; H05K 2203/308
USPC ............. 361/301.1, 301.4, 303, 306.1, 306.3, 361/310, 321.1, 321.2, 760, 763
See application file for complete search history.

(56) References Cited

U.S. PATENT DOCUMENTS

| | | | | |
|---|---|---|---|---|
| 4,856,102 | A | * | 8/1989 | Insetta et al. ................ 361/330 |
| 5,018,047 | A | * | 5/1991 | Insetta et al. ................ 361/277 |
| 7,864,542 | B2 | * | 1/2011 | Inagaki et al. .............. 361/763 |

FOREIGN PATENT DOCUMENTS

| | | |
|---|---|---|
| JP | 2001-126950 | 5/2001 |
| JP | 2002-271032 | 9/2002 |
| JP | 2006-196818 | 7/2006 |
| JP | 2006-216709 | 8/2006 |
| KR | 10-2009-0049330 | 5/2009 |

(Continued)

OTHER PUBLICATIONS

Korean Office Action mailed Dec. 19, 2013 in corresponding Korean Application No. 10-2012-0108952.

(Continued)

*Primary Examiner* — Hoa C Nguyen
(74) *Attorney, Agent, or Firm* — NSIP Law

(57) ABSTRACT

The present invention relates to a passive device embedded in a substrate, which includes a laminate formed by alternately laminating a plurality of internal electrodes and dielectric layers; a first external electrode covering one side surface of the laminate and having a first upper cover region, which covers a part of an upper portion of the laminate, and a first lower cover region, which covers a part of a lower portion of the laminate and is smaller than the first upper cover region; and a second external electrode covering the other side surface of the laminate and having a second lower cover region, which covers a part of the lower portion of the laminate, and a second upper cover region, which covers a part of the upper portion of the laminate and is smaller than the second lower cover region, and the substrate.

10 Claims, 4 Drawing Sheets

(56) References Cited

FOREIGN PATENT DOCUMENTS

| | | |
|---|---|---|
| KR | 10-2009-0060551 | 6/2009 |
| TW | I424454 | 1/2014 |

OTHER PUBLICATIONS

Taiwanese Office Action dated Nov. 28, 2014 in corresponding Taiwanese Patent Application No. 102134440.

* cited by examiner

- PRIOR ART -

- PRIOR ART -

PASSIVE DEVICE EMBEDDED IN SUBSTRATE AND SUBSTRATE WITH PASSIVE DEVICE EMBEDDED THEREIN

CROSS-REFERENCE TO RELATED APPLICATIONS

Claim and incorporate by reference domestic priority application and foreign priority application as follows:

CROSS REFERENCE TO RELATED APPLICATION

This application claims the foreign priority benefit of Korean Patent Application No. 10-2012-0108952, filed Sep. 28, 2012, the contents of which are incorporated herein by reference.

BACKGROUND OF THE INVENTION

1. Field of the Invention

The present invention relates to a passive device embedded in a substrate and a substrate with a passive device embedded therein, and more particularly, to a passive device embedded in a substrate and a substrate with a passive device embedded therein that can improve a structure of an external electrode.

2. Description of the Related Art

With the trend of miniaturization of electronic products, the size and thickness of components are reduced according to the trend of the electronic products, and the components have been developed to be highly integrated and multifunctional. A PCB method according to this trend is a device embedded electronic circuit board.

Currently, a method of manufacturing a device embedded electronic circuit board embeds a device in a circuit board, forms layers by a layer lamination method which is a substrate manufacturing method, and electrically connects the layers using an interlayer connection method. As a typical interlayer connection method, there is a method of forming a via to conduct layers. As a via forming method, there is a laser or drilling method but a punching method using laser is most commonly used according to the trend toward precision.

A current interlayer connection method processes a via by a laser interconnection method and conducts layers by a plating method after an embedding process of embedding a device in a cavity and fixing and embedding the device by a lamination process which is a substrate process. In order to obtain a high yield in this process, laser processing deviation and accuracy when fixing the device in the cavity are very important.

In general, a via-hole is formed by laser and electrically connected to an electrode of an embedded passive device, for example, MLCC. In a technique of forming a via-hole by laser, a via size may be changed according to the thickness of laminated materials or post-processing after laser processing, but the bottom size of the via generally has a diameter of at least about 35 μm. According to the development trend of the substrate, since patterns get thinner and highly integrated, it is expected that the bottom size of the via is developed to a level of at least about 30 μm. It is because there may be problems with electrical connection when the diameter of the via is reduced to less than 30 μm.

FIG. 4 shows that a conventional passive device 6 is embedded in a conventional passive device embedded substrate. A circuit is formed after fixing the conventional passive device 6 by sequentially laminating insulating layers 4, a via-hole is formed by laser, and only an upper side is processed or vias 5a are processed on the upper and lower sides to electrically connect circuit patterns 5b and the passive device 6 as in FIG. 4. This conventional method could be applied without any problems since the size of the passive device 6 is large and the area of an external electrode exposed on the passive device 6 on the plane is sufficiently larger than the bottom size of the via 5a.

The conventional method shown in FIG. 4 is a technique that can be applied only to the passive device 6 having a sufficient pad size during laser processing. However, the size of the passive device 6, for example, MLCC is gradually reduced to a size having difficulty in processing an upper pad with laser.

Referring to FIG. 5, in case of the embedded passive device 6, for example, MLCC, as the size thereof gets smaller, a part of the bottom of the via 5a may deviate from the pad, for example, the external electrode due to an alignment deviation when connecting the vias 5a to the upper and lower pads of the external electrode of the passive device 6. At this time, an alignment deviation of the via 5a may occur and thus the device may fail to function due to impact applied to the device when punching the via-hole.

RELATED ART DOCUMENT

Patent Document

Patent Document 1: Korean Patent Laid-open Publication No. 10-2009-0049330 (laid-open on May 18, 2009)
Patent Document 2: Korean Patent Laid-open Publication No. 10-2009-0060551 (laid-open on Jun. 15, 2009)

SUMMARY OF THE INVENTION

The present invention has been invented in order to overcome the above-described problems and it is, therefore, an object of the present invention to provide a passive device with an improved structure according to the trend of reducing the size of a device embedded in a device embedded substrate, and a substrate with a passive device embedded therein.

In accordance with a first embodiment of the present invention to achieve the object, there is provided a passive device embedded in a substrate including: a laminate formed by alternately laminating a plurality of internal electrodes and dielectric layers; a first external electrode covering one side surface of the laminate and having a first upper cover region, which covers a part of an upper portion of the laminate, and a first lower cover region, which covers a part of a lower portion of the laminate and has a smaller area than the first upper cover region; and a second external electrode covering the other side surface of the laminate and having a second lower cover region, which covers a part of the lower portion of the laminate, and a second upper cover region, which covers a part of the upper portion of the laminate and has a smaller area than the second lower cover region, wherein the first upper cover region is larger than the second upper cover region, and the second lower cover region has a larger area than the first lower cover region.

At this time, in an example, the first upper cover region may cover more than half of the upper area of the laminate, and the second lower cover region may cover more than half of the lower area of the laminate.

Further, in accordance with an example, vias may be mounted on the first upper cover region and the second lower cover region when the passive device is embedded in a substrate, and the size of each of the first upper cover region and the second lower cover region may be more than 5 times larger than the bottom size of the via.

Further, in an example, the first upper cover region and the second upper cover region of the second external electrode, which covers a part of the upper portion of the laminate, may be separated not to electrically interfere with each other, and the second lower cover region and the first lower cover region of the first external electrode, which covers a part of the lower portion of the laminate, may be separated not to electrically interfere with each other.

In accordance with another example, the size of the passive device may be less than 400 μm wide×200 μm long.

Further, in an example, the passive device may be a capacitor in which the first external electrode is electrically connected to some of the plurality of internal electrodes and the second external electrode is electrically connected to the rest of the plurality of internal electrodes.

Next, in accordance with a second embodiment of the present invention to achieve the object, there is provided a substrate with a passive device embedded therein, including: a core layer having a cavity; a passive device including a laminate formed by alternately laminating a plurality of internal electrodes and dielectric layers, a first external electrode having a first upper cover region, which covers a part of an upper portion of the laminate, and a first lower cover region, which covers a part of a lower portion of the laminate and has a smaller area than the first upper cover region, and a second external electrode having a second lower cover region, which covers a part of the lower portion of the laminate, and a second upper cover region, which covers a part of the upper portion of the laminate and has a smaller area than the second upper cover region, wherein the first upper cover region is larger than the second upper cover region, and the second lower upper region has a larger area than the first lower cover region, and embedded in the cavity; insulating layers laminated on and under the core layer; circuit patterns formed on the insulating layers; and vias respectively mounted on the first upper cover region and the second lower cover region of the passive device through the insulating layers to electrically connect the first and second external electrodes to the circuit patterns.

At this time, in an example, the first upper cover region may cover more than half of the upper area of the laminate, and the second lower cover region may cover more than half of the lower area of the laminate.

Further, in accordance with an example, the size of each of the first upper cover region and the second lower cover region may be more than 5 times larger than the bottom size of the via.

In another example, the first upper cover region and the second upper cover region of the second external electrode, which covers a part of the upper portion of the laminate, may be separated not to electrically interfere with each other, and the second lower cover region and the first lower cover region of the first external electrode, which covers a part of the lower portion of the laminate, may be separated not to electrically interfere with each other.

Further, in an example, the size of the passive device may be less than 400 μm wide×200 μm long.

In accordance with another example, the passive device may be a capacitor in which the first external electrode is electrically connected to some of the plurality of internal electrodes and the second external electrode is electrically connected to the rest of the plurality of internal electrodes.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
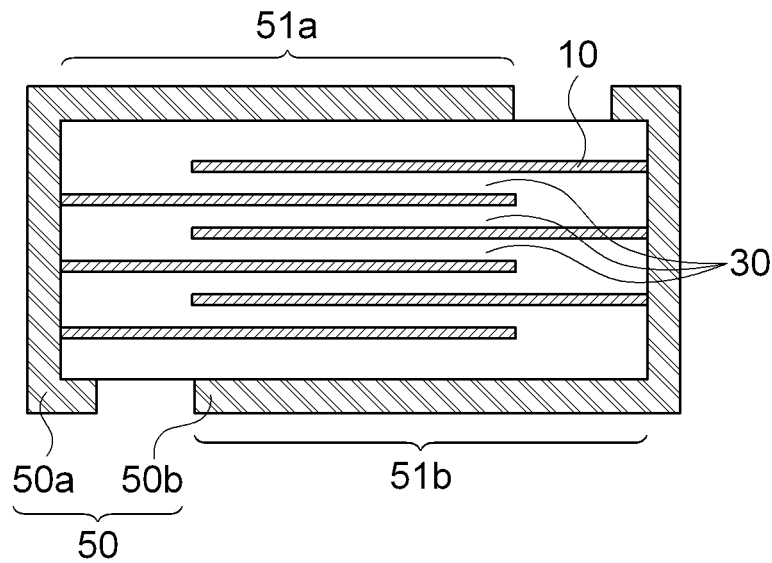
FIG. 1 is a cross-sectional view schematically showing a passive device embedded in a substrate in accordance with an embodiment of the present invention.

Embodiments of the present invention to achieve the above-described objects will be described with reference to the accompanying drawings. In this description, the same elements are represented by the same reference numerals, and additional description which is repeated or limits interpretation of the meaning of the invention may be omitted.

In this specification, when an element is referred to as being "connected or coupled to" or "disposed in" another element, it can be "directly" connected or coupled to or "directly" disposed in the other element or connected or coupled to or disposed in the other element with another element interposed therebetween, unless it is referred to as being "directly coupled or connected to" or "directly disposed in" the other element.

Although the singular form is used in this specification, it should be noted that the singular form can be used as the concept representing the plural form unless being contradictory to the concept of the invention or clearly interpreted otherwise. It should be understood that the terms such as "having", "including", and "comprising" used herein do not preclude existence or addition of one or more other elements or combination thereof.

The drawings referenced in this specification are provided as examples to describe the embodiments of the present invention, and the shape, the size, and the thickness may be exaggerated in the drawings for effective description of technical features.

First, a passive device embedded in a substrate in accordance with a first embodiment of the present invention will be specifically described with reference to the drawing. At this time, the reference numeral that is not mentioned in the reference drawing may be the reference numeral that represents the same element in another drawing.

Figure 2:
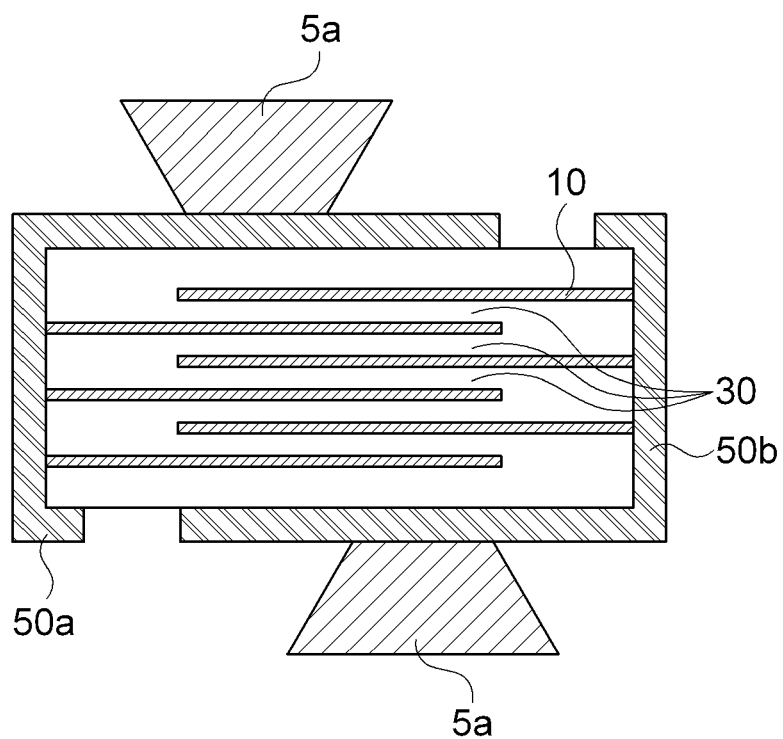
FIG. 2 is a cross-sectional view schematically showing a passive device embedded in a substrate in accordance with another embodiment of the present invention.

FIG. 1 is a cross-sectional view schematically showing a passive device embedded in a substrate in accordance with an embodiment of the present invention, and FIG. 2 is a cross-sectional view schematically showing a passive device embedded in a substrate in accordance with another embodiment of the present invention.

Referring to FIG. 1, a passive device embedded in a substrate in accordance with an example includes a laminate formed by alternately laminating a plurality of internal electrodes 10 and dielectric layers 30, a first external electrode 50a, and a second external electrode 50b.

In this specification, the terms "first" and "second" don't mean the order or the number but are merely added to distinguish the components.

Specifically, the first external electrode 50a is formed to cover one side surface of the laminate of the plurality of internal electrodes 10 and dielectric layers 30. For example, a first side cover region of the first external electrode 50a covers the side surface of one end of the laminate, a first upper cover region 51a of the first external electrode 50a extends from the first side cover region to cover a part of an upper portion of the laminate, and a first lower cover region of the first external electrode 50a extends from the first side cover region to cover a part of a lower portion of the laminate. At this time, the first upper cover region 51a of the first external electrode 50a, which covers a part of the upper portion of the laminate, is larger than the first lower cover region, which covers a part of the lower portion of the laminate. In FIG. 1, the reference numeral 51a represents the first upper cover region of the first external electrode 50a, and the reference numeral of the first lower cover region of the first external electrode 50a is not shown. In addition, referring to FIGS. 2 and/or 3f, the first upper cover region 51a is larger than a second upper cover region (reference numeral is not shown) of the second external electrode 50b which covers another part of the upper portion of the laminate. Accordingly, a substrate with a passive device embedded therein can be processed or manufactured so that a via 5a can be stably mounted on the first upper cover region 51a from the upper side.

Figure 4:
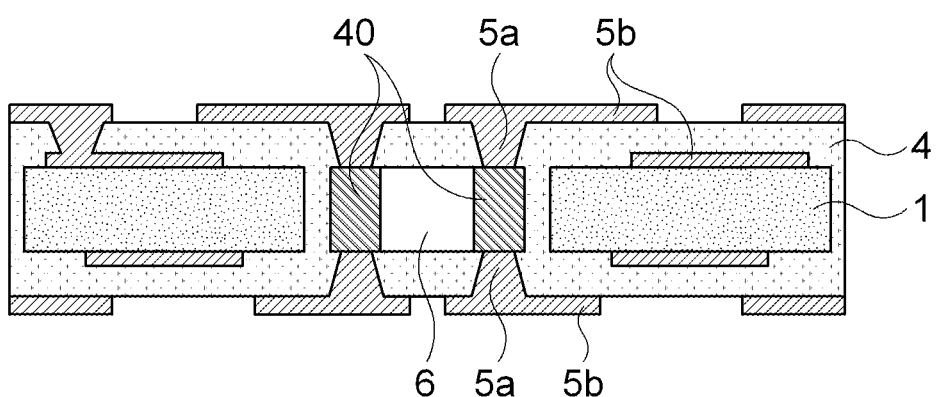
FIG. 4 is a cross-sectional view schematically showing a conventional substrate with a passive device embedded therein.
Figure 5:
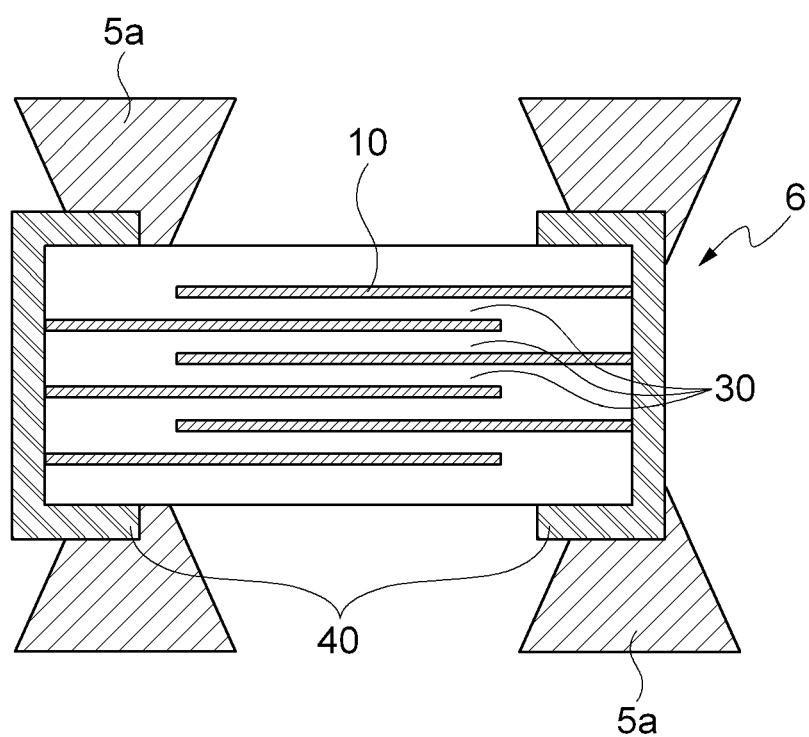
FIG. 5 is a cross-sectional view schematically showing a conventional passive device embedded in a substrate.

At this time, in accordance with an example, the first upper cover region 51a extending from the first side cover region of the first external electrode 50a may cover more than half of the upper area of the laminate. For example, the size of the first upper cover region 51a of the first external electrode 50a may be approximately more than 5 times larger than the bottom size of the via 5a before pretreatment to stably overcome an alignment deviation when embedded in a substrate and connected to the via 5a. For example, in case of 0402 MLCC which is a very small passive device, when the bottom size of the via 5a is 40 μm, since it is not possible to secure the interval between the external electrodes for minimizing interference by the conventional external electrode structure shown in FIGS. 4 and 5, it is not possible to prepare a space 5 times the bottom size of the via. Further, if the space is 5 times the bottom size of the via when the bottom size is 35 μm, that is, if the space is about 175 μm, since the interval between the external electrodes is reduced in the typical conventional external electrode structure, there are concerns of interference. For example, in order to have an external electrode pad region of about 5.28 times the bottom size according to the commonly used standards, a size of about 185 μm is needed. In the typical conventional external electrode structure, since the interval between the electrodes is only about 30 μm, it may difficult to substantially implement an electrode pad size when considering minimization of interference. As the size of the very small passive device gets smaller, there are problems.

Next, the second external electrode 50b is formed to cover the other side surface of the laminate. For example, a second side cover region of the second external electrode 50b covers the side surface of the other end of the laminate, a second lower cover region 51b of the second external electrode 50b extends from the second side cover region to cover a part of the lower portion of the laminate, specifically a part of the lower region which isn't covered by the first lower cover region of the first external electrode 50a, and a second upper cover region of the second external electrode 50b extends from the second side cover region to cover a part of the upper portion of the laminate, specifically a part of the upper region which isn't covered by the first upper cover region 51a of the first external electrode 50a. At this time, the second lower cover region 51b, which covers a part of the lower portion of the laminate, is larger than the second upper cover region, which covers a part of the upper portion of the laminate. In addition, referring to FIGS. 2 and/or 3f, the second lower cover region 51b is larger than the first lower cover region (reference numeral isn't shown) of the first external electrode 51a which covers another part of the lower portion of the laminate. Accordingly, the via 5a can be stably mounted on the second lower cover region 51b from the lower side.

At this time, in accordance with an example, the second lower cover region 51b of the second external electrode 50b may cover more than half of the lower area of the laminate. Further, the first upper cover region 51a extending from the first side cover region of the first external electrode 50a may cover more than half of the upper area of the laminate. Accordingly, the vias 5a can be stably mounted on the first upper cover region 51a and the second lower cover region 51b from the upper and lower sides when a passive device 3 embedded in a substrate is embedded in a substrate.

Referring to FIG. 2, the size of each of the first upper cover region 51a and the second lower cover region 51b is sufficiently larger than the bottom size of the vias 5a mounted on the first upper cover region 51a and the second lower cover region 51b when the passive device embedded in a substrate is embedded in the substrate. Accordingly, the via 5a can be stably mounted on an external electrode 50 of the embedded passive device 3 even when embedding the embedded passive device 3.

For example, in an example, when the embedded passive device 3 is embedded in the substrate, the vias 5a can be stably mounted on the first upper cover region 51a and the second lower cover region 51b. The first upper cover region 51a and/or the second lower cover region 51b of the external electrode 50 of the passive device embedded in a substrate, on which the vias 5a are mounted, may be approximately 5 times larger than the bottom size of the via 5a before pretreatment in order to stably overcome an alignment deviation. For example, the bottom size of the via 5a may be calculated considering via-hole processing deviation (for example, CNC or laser processing deviation), cavity processing deviation, device embedding tolerance, etc.

Further, referring to FIGS. 1 and 2, in an example, the first upper cover region 51a and the second upper cover region of the second external electrode 50b, which covers a part of the upper portion of the laminate, are separated not to electrically interfere with each other. Further, the second lower cover region 51b and the first lower cover region of the first external electrode 50a, which covers a part of the lower portion of the laminate, are separated not to electrically interfere with each other. For example, in order to prevent the interference between the first external electrode 50a and the second external electrode 50b on the surface of the very small passive device, the surface cover region of one of the first external electrode 50a and the second external electrode 50b, not both of the first external electrode 50a and the second external electrode 50b, may be more than 50% of the surface area. According to an embodiment, on the upper surface or the lower surface of the passive device, when the size of the surface cover region of one of the first external electrode 50a and the second external electrode 50b is large enough to mount the via 50a thereon, the surface cover region of one of the first external electrode 50a and the second external electrode 50b may be larger than that of the other of the external electrode 50a and the second external electrode 50b to prevent the interference between the first external electrode 50a and the second external electrode 50*b* even though it doesn't reach 50% of the surface area of the upper or lower surface.

In general, the distance between the electrodes should be approximately at least more than 140 µm to suppress occurrence of a short due to ion migration between the electrodes. Thus, in case of 0402 MLCC, the first upper cover region 51*a* and the second lower cover region 51*b* of the external electrode may cover less than about 65% of the surface area but is not limited thereto.

In an example, the size of the small passive device may be approximately less than 400 µm wide×200 µm long.

Further, in an example, in the small passive device, the first external electrode 50*a* may be electrically connected to some of the plurality of internal electrodes 10 and the second external electrode 50*b* may be electrically connected to the rest of the plurality of internal electrodes 10. That is, the small passive device may be a multilayer capacitor.

Next, a substrate with a passive device embedded therein in accordance with a second embodiment of the present invention will be specifically described with reference to the drawing. At this time, the passive device embedded in a substrate in accordance with the above-described first embodiment and FIGS. 1 and 2 will be referenced. Thus, repeated descriptions may be omitted.

FIGS. 3*a* to 3*f* are views schematically showing a method for manufacturing a substrate with a passive device embedded therein in accordance with another embodiment of the present invention. A substrate with a passive device embedded therein in accordance with an embodiment will be described based on the manufacturing method of FIGS. 3*a* to 3*f*.

Figure 3A:
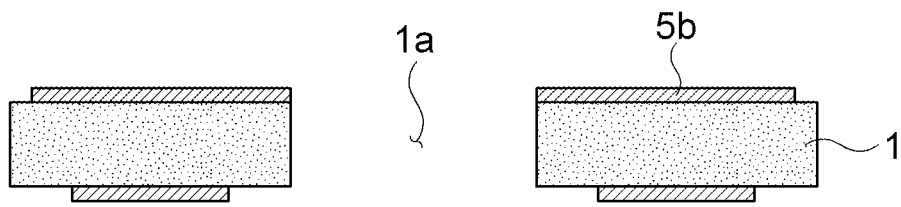
FIGS. 3a to 3f are views schematically showing a method for manufacturing a substrate with a passive device embedded therein in accordance with another embodiment of the present invention.
Figure 3B:
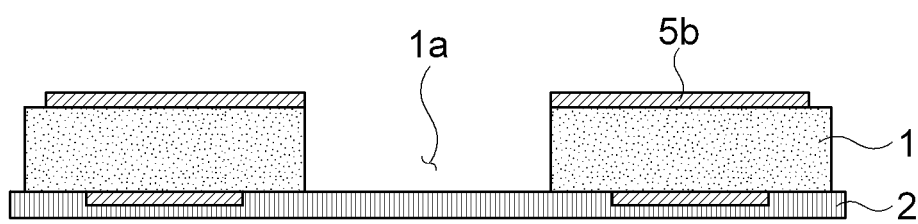
Figure 3C:
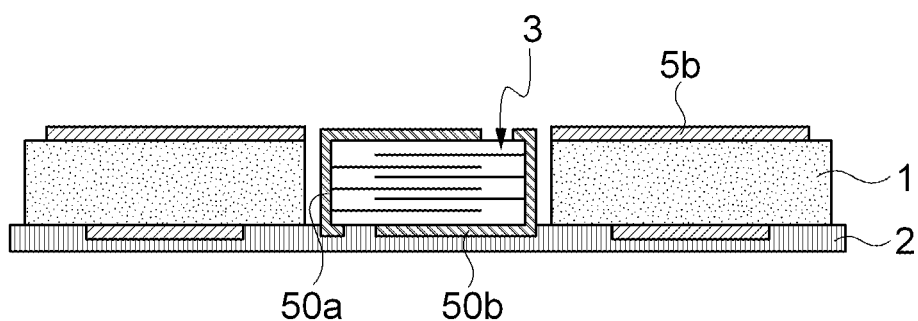
Figure 3D:
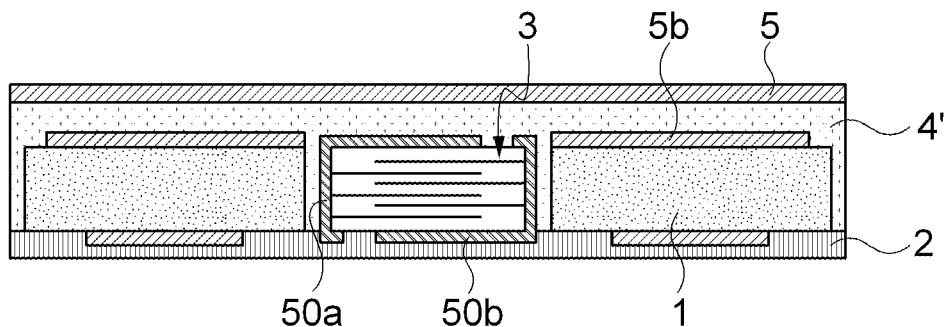
Figure 3E:
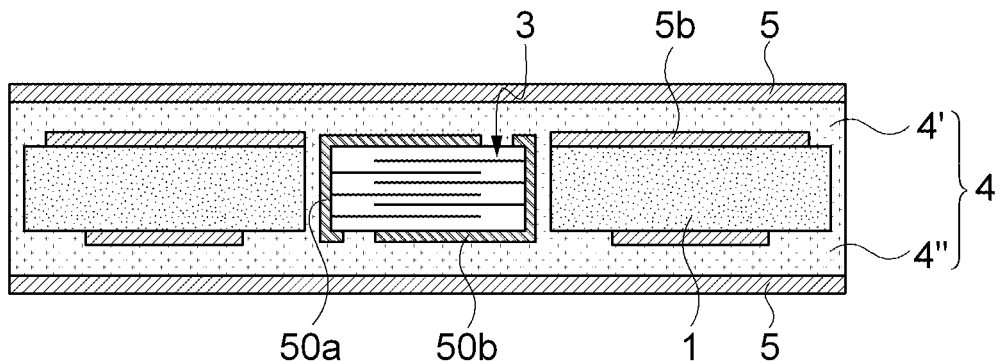
Figure 3F:
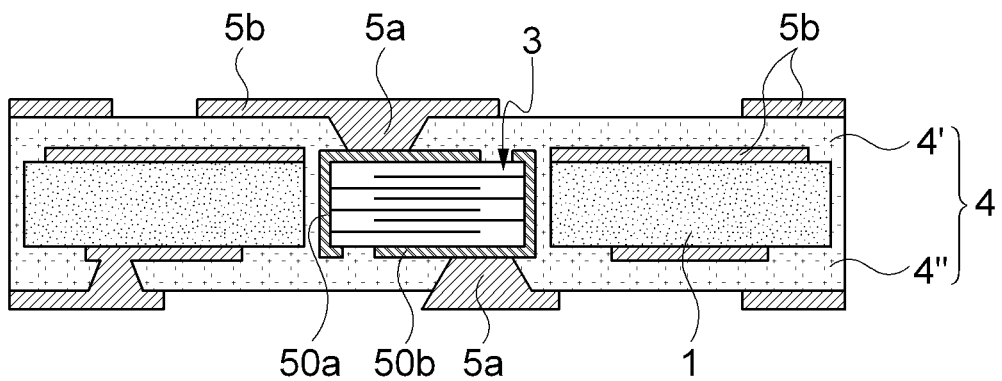

Referring to FIG. 3*f*, a substrate with a passive device embedded therein in accordance with an example may include a core layer 1, an embedded passive device 3, an insulating layer 4, a circuit pattern 5*b*, and a via 5*a*.

Specifically, a cavity 1*a* is formed in the core layer 1. The cavity 1*a* is a space in which the passive device 3 is to be inserted. At this time, the circuit pattern 5*b* may be formed on the core layer 1.

Next, the embedded passive device 3 is embedded in the cavity 1*a*. At this time, the passive device 3 includes a laminate, a first external electrode 50*a*, and a second external electrode 50*b*. The laminate of the passive device 3 is formed by alternately laminating a plurality of internal electrodes 10 and dielectric layers 30. Accordingly, the laminate has a shape in which the plurality of internal electrodes 10 are inserted in the dielectric. The first external electrode 50*a* is formed to cover one side surface of the laminate. At this time, the first external electrode 50*a* having a first upper cover region 51*a*, which covers a part of an upper portion of the laminate, and a first lower cover region, which covers a part of a lower portion of the laminate and has a smaller area than the first upper cover region 51*a*, is formed. Further, the second external electrode 50*b* is formed to cover the other side surface of the laminate. At this time, the second external electrode 50*b* having a second lower cover region 51*b*, which covers a part of the lower portion of the laminate, and a second upper cover region, which covers a part of the upper portion of the laminate and has a smaller area than the second lower cover region 51*b*, is formed. In addition, the first upper cover region 51*a* of the first external electrode 50*a* is larger than the second upper cover region (reference numeral isn't shown) of the second external electrode 50*b* which covers another part of the upper portion of the laminate, and the second lower cover region 51*b* of the second external electrode 50*b* is larger than the first lower cover region (reference numeral isn't shown) of the first external electrode 50*a* which covers another part of the lower portion of the laminate. Accordingly, the vias 5*a* can be stably mounted on the first upper cover region 51*a* and the second lower cover region 51*b* from the upper and lower sides when embedding the embedded passive device 3 in a substrate.

At this time, in accordance with an example, the first upper cover region 51*a* of the first external electrode 50*a* extending from a first side cover region which covers the side surface of one end of the laminate may cover more than half of the upper area of the laminate. At this time, the second lower cover region 51*b* of the second external electrode 50*b* extending from a second side cover region which covers the side surface of the other end of the laminate may cover more than half of the lower area of the laminate.

Next, in FIG. 3*f*, the insulating layers 4, 4', 4" are laminated on and under the core layer 1 in which the embedded passive device 3 is embedded.

Next, in FIG. 3*f*, the circuit pattern 5*b* is formed on the insulating layer 4, 4', 4". At this time, the circuit pattern 5*b* may form a conductive layer 5 with the via 5*a*.

Further, the via 5*a* is formed in a via-hole passing through the insulating layer 4, 4', 4". For example, the via 5*a* may be formed by filling a conductive material. The vias 5*a* are mounted on the first upper cover region 51*a* and the second lower cover region 51*b* of the embedded passive device 3, respectively. The conductive via 5*a* electrically connects the first and second external electrodes 50*a* and 50*b* of the embedded passive device 3 and the circuit pattern 5*b* formed on the insulating layer 4, 4', 4".

At this time, referring to FIGS. 2 and 3*f*, in an example, the size of each of the first upper cover region 51*a* and the second lower cover region 51*b* is larger than the bottom size of the vias 5*a* mounted on the first upper cover region 51*a* and the second lower cover region 51*b*.

For example, in an example, the first upper cover region 51*a* and/or the second lower cover region 51*b* of an external electrode 50 of the passive device 3 embedded in a substrate, on which the vias 5*a* are mounted, may be approximately 5 times larger than the bottom size of the via 5*a* before pretreatment in order to stably overcome an alignment deviation.

Further, referring to FIGS. 2 and 3*f*, in an example, the first upper cover region 51*a* and the second upper cover region of the second external electrode 50*b*, which covers a part of the upper portion of the laminate, are separated not to electrically interfere with each other, and the second lower cover region 51*b* and the first lower cover region of the first external electrode 50*a*, which covers a part of the lower portion of the laminate, are separated not to electrically interfere with each other.

Further, in an example, the size of the embedded passive device 3 may be approximately less than 400 µm wide×200 µm long.

In accordance with another example, the embedded passive device 3 may be a capacitor in which the first external electrode 50*a* is electrically connected to some of the plurality of internal electrodes 10 and the second external electrode 50*b* is electrically connected to the rest of the plurality of internal electrodes 10.

Next, a method for manufacturing a substrate with a passive device embedded therein in accordance with a second embodiment of the present invention will be specifically described with reference to FIGS. 3*a* to 3*f*.

First, referring to FIG. 3*a*, a cavity 1*a* is formed in a core substrate or a core layer 1. At this time, a circuit pattern 5*b* may be formed on a surface of the core substrate 1. The cavity 1*a* is a space in which an embedded passive device 3 is to be embedded.

Next, referring to FIG. 3b, a lower portion of the core substrate 1 having the cavity 1a is taped using, for example, a tape 2 to temporarily fix the embedded passive device 3. That is, a bottom of the cavity 1a, on which the embedded passive device 3 is mounted, is formed using, for example, the tape 2.

Next, referring to FIG. 3c, the embedded passive device 3 is inserted in the cavity 1a of the core substrate 1, whose bottom is formed by taping. At this time, for example, the embedded passive device 3 may be manufactured by alternately laminating a plurality of internal electrodes 10 and dielectric layers 30 to form a laminate and forming a first external electrode 50a, which covers one end of the laminate, and a second external electrode 50b, which covers the other end of the laminate. At this time, the first external electrode 50a is formed so that a first upper cover region 51a, which covers a part of an upper portion of the laminate, is larger than a first lower cover region, which covers a part of a lower portion of the laminate. And the second external electrode 50b is formed so that a second lower cover region 51b, which covers a part of the lower portion of the laminate, is larger than a second upper cover region, which covers a part of the upper portion of the laminate. Further, at this time, the first upper cover region 51a is larger than the second upper cover region (reference numeral isn't shown) and the second lower cover region 51b is larger than the first lower cover region (reference numeral isn't shown) so that vias 5a can be stably mounted on the first upper cover region 51a and the second lower cover region 51b.

For example, at this time, the first upper cover region 51a of the first external electrode 50a may be formed to cover more than half of the upper area of the laminate, and the second lower cover region 51b of the second external electrode 50b may be formed to cover more than half of the lower area of the laminate.

For example, at this time, referring to FIG. 3c, the first external electrode 50a and the second external electrode 50b may be formed so that the first upper cover region 51a and the second upper cover region of the second external electrode 50b, which covers a part of the upper portion of the laminate, are separated not to electrically interfere with each other, and the second lower cover region 51b and the first lower cover region of the first external electrode 50a, which covers a part of the lower portion of the laminate, are separated not to electrically interfere with each other.

For example, in FIG. 3c, the size of the embedded passive device 3 inserted in the cavity 1a may be approximately less than 400 μm wide×200 μm long.

Further, in an example, in FIG. 3c, the embedded passive device 3 inserted in the cavity 1a may be a capacitor in which the first external electrode 50a is electrically connected to some of the plurality of internal electrodes 10 and the second external electrode 50b is electrically connected to the rest of the plurality of internal electrodes 10.

Next, referring to FIG. 3d, after inserting the embedded passive device 3 in the cavity 1a, an insulating layer 4' is laminated on an upper surface of the core substrate 1. Further, a conductive layer, for example, a conductive metal layer 5 is formed on the insulating layer 4'. For example, the conductive metal layer 5 may be formed on the insulating layer 4' through a conductive metal foil or plating. For example, the conductive metal layer 5 may be formed by coating a metal foil on the prepreg (PPG) insulating layer 4' or the conductive metal layer may be formed on the insulating layer 4' using a resin coated copper foil (RCC).

Next, referring to FIG. 3e, after laminating the insulating layer 4' on one surface of the core substrate 1, the tape 2 attached to the other surface of the core substrate 1, that is, a lower surface is removed, and the insulating layer 4" is laminated on the other surface of the core substrate 1, that is, the lower surface as in FIG. 3d. Further, the conductive metal layer 5 is formed on the insulating layer 4". For example, the conductive metal layer 5 may be formed on the insulating layer 4" through a conductive metal foil or plating.

And, referring to FIG. 3f, a via-hole is punched in the insulating layer 4, 4', 4" to form a via 5a. Further, a circuit pattern 5b is formed by partially removing the conductive metal layer 5 formed on the insulating layer 4, 4', 4" through a semi-additive or subtractive method. For example, the vias 5a mounted on the first upper cover region 51a and the second lower cover region 51b of the embedded passive device 3 are formed through the conductive metal layer 5 and the insulating layer 4, 4' 4" simultaneously with or before/after the formation of the circuit pattern 5b. The via-hole may be punched, for example, by Yag or $CO_2$ laser processing etc. At this time, the via-hole is punched so that the entire bottom region of the via-hole is included in the first upper cover region 51a and the second lower cover region 51b.

The via 5a is formed by filling a conductive material, for example, the same material as the conductive metal layer 5, in the punched via-hole. The filling of the via-hole may be performed by electroplating, electroless plating, or conductive paste filling. For example, the filling of the via-hole may be performed through a via fill process by plating. At this time, before filling the conductive material, a seed layer (not shown) may be formed on an inner wall of the via-hole. Further, an adhesive layer (not shown) may be formed between the seed layer and the inner wall of the via-hole.

According to the embodiment of the present invention, it is possible to complement the limitations due to laser via processing by changing a pad of a passive device, for example, an external electrode structure in response to the trend of reducing the size of a device embedded in a device embedded substrate.

According to the embodiment of the present invention, it is possible to secure a stable yield by overcoming an alignment deviation when inserting and fixing a passive device in a cavity and an alignment deviation when processing a via.

It is apparent that various effects which have not been directly mentioned according to the various embodiments of the present invention can be derived by those skilled in the art from various constructions according to the embodiments of the present invention.

The above-described embodiments and the accompanying drawings are provided as examples to help understanding of those skilled in the art, not limiting the scope of the present invention. Further, embodiments according to various combinations of the above-described components will be apparently implemented from the foregoing specific descriptions by those skilled in the art. Therefore, the various embodiments of the present invention may be embodied in different forms in a range without departing from the essential concept of the present invention, and the scope of the present invention should be interpreted from the invention defined in the claims. It is to be understood that the present invention includes various modifications, substitutions, and equivalents by those skilled in the art.

What is claimed is:

1. A substrate with a passive device embedded therein, comprising:
    a core layer having a cavity;
    a passive device comprising
        a laminate formed by alternately laminating a plurality of internal electrodes and dielectric layers, a first external electrode having a first upper cover region, which covers a part of an upper portion of the laminate, and a first lower cover region, which covers a part of a lower portion of the laminate and has a smaller area than the first upper cover region, and a second external electrode having a second lower cover region, which covers a part of the lower portion of the laminate, and a second upper cover region, which covers a part of the upper portion of the laminate and has a smaller area than the second upper cover region, wherein the first upper cover region is larger than the second upper cover region, and the second lower upper region has a larger area than the first lower cover region, and embedded in the cavity;

insulating layers laminated on and under the core layer;

circuit patterns formed on the insulating layers; and vias respectively mounted on the first upper cover region and the second lower cover region of the passive device through the insulating layers to electrically connect the first and second external electrodes to the circuit patterns, wherein only one via is on the first upper cover region of the passive device and only one via is on the second lower cover region of the passive device.

2. The substrate with a passive device embedded therein according to claim 1, wherein the first upper cover region covers more than half of the upper area of the laminate, and the second lower cover region covers more than half of the lower area of the laminate.

3. The substrate with a passive device embedded therein according to claim 2, wherein the passive device is a capacitor in which the first external electrode is electrically connected to some of the plurality of internal electrodes and the second external electrode is electrically connected to the rest of the plurality of internal electrodes.

4. The substrate with a passive device embedded therein according to claim 1, wherein the size of each of the first upper cover region and the second lower cover region is more than 5 times larger than the bottom size of the via.

5. The substrate with a passive device embedded therein according to claim 4, wherein the passive device is a capacitor in which the first external electrode is electrically connected to some of the plurality of internal electrodes and the second external electrode is electrically connected to the rest of the plurality of internal electrodes.

6. The substrate with a passive device embedded therein according to claim 1, wherein the first upper cover region and the second upper cover region are separated not to electrically interfere with each other, and the second lower cover region and the first lower cover region are separated not to electrically interfere with each other.

7. The substrate with a passive device embedded therein according to claim 6, wherein the passive device is a capacitor in which the first external electrode is electrically connected to some of the plurality of internal electrodes and the second external electrode is electrically connected to the rest of the plurality of internal electrodes.

8. The substrate with a passive device embedded therein according to claim 1, wherein the size of the passive device is less than 400 µm wide×200 µm long.

9. The substrate with a passive device embedded therein according to claim 8, wherein the passive device is a capacitor in which the first external electrode is electrically connected to some of the plurality of internal electrodes and the second external electrode is electrically connected to the rest of the plurality of internal electrodes.

10. The substrate with a passive device embedded therein according to claim 1, wherein the passive device is a capacitor in which the first external electrode is electrically connected to some of the plurality of internal electrodes and the second external electrode is electrically connected to the rest of the plurality of internal electrodes.

* * * * *